(12) United States Patent
Wang et al.

(10) Patent No.: US 11,651,977 B2
(45) Date of Patent: May 16, 2023

(54) PROCESSING OF WORKPIECES USING FLUOROCARBON PLASMA

(71) Applicants: Mattson Technology, Inc., Fremont, CA (US); Beijing E-Town Semiconductor Technology, Co., LTD, Beijing (CN)

(72) Inventors: Shanyu Wang, Fremont, CA (US); Chun Yan, San Jose, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 39 days.

(21) Appl. No.: 17/217,019

(22) Filed: Mar. 30, 2021

(65) Prior Publication Data
US 2021/0305071 A1 Sep. 30, 2021

Related U.S. Application Data

(60) Provisional application No. 63/002,571, filed on Mar. 31, 2020.

(51) Int. Cl.
| | |
|---|---|
| *H01L 21/3065* | (2006.01) |
| *H01L 21/67* | (2006.01) |
| *H01J 37/32* | (2006.01) |
| *H01L 21/3213* | (2006.01) |
| *H01L 21/02* | (2006.01) |

(52) U.S. Cl.
CPC ...... *H01L 21/67069* (2013.01); *H01J 37/321* (2013.01); *H01J 37/32357* (2013.01); *H01J 37/32449* (2013.01); *H01J 37/32788* (2013.01); *H01L 21/02071* (2013.01); *H01L 21/32136* (2013.01); *H01J 2237/334* (2013.01)

(58) Field of Classification Search
CPC ......... H01L 21/31116; H01L 21/32136; H01L 21/3065
See application file for complete search history.

(56) References Cited

U.S. PATENT DOCUMENTS

| | | |
|---|---|---|
| 5,399,237 A | 3/1995 | Keswick et al. |
| 5,948,702 A | 9/1999 | Rotondaro |
| 6,531,404 B1 | 3/2003 | Nallan et al. |
| | (Continued) | |

OTHER PUBLICATIONS

Wu et al., "Titanium Nitride Hard Mask Removal with Selectivity to Tungsten in FEOL," ISSN: 1662-9779, vol. 255, Sep. 5, 2016, pp. 91-96.

(Continued)

*Primary Examiner* — Thomas T Pham
(74) *Attorney, Agent, or Firm* — Dority & Manning, P.A.

(57) ABSTRACT

Methods for processing a workpiece are provided. Conducting a thermal treatment on a workpiece are provided. The workpiece contains at least one layer of metal. The method can include generating one or more species from a process gas. The process gas can include hydrogen or deuterium. The method can include filtering the one or more species to create a filtered mixture and exposing the workpiece to the filtered mixture. An oxidation process on a workpiece are provided. The method can be conducted at a process temperature of less than 350° C.

19 Claims, 10 Drawing Sheets

(56) References Cited

U.S. PATENT DOCUMENTS

| | | |
|---|---|---|
| 9,064,815 B2 | 6/2015 | Zhang et al. |
| 9,275,834 B1 * | 3/2016 | Park .................. H01L 21/32136 |
| 9,449,845 B2 | 9/2016 | Liu et al. |
| 2007/0117396 A1 | 5/2007 | Wu et al. |
| 2013/0005140 A1 | 1/2013 | Jeng et al. |
| 2014/0179111 A1 * | 6/2014 | Liu .................. H01J 37/32357 |
| | | 438/720 |
| 2017/0260449 A1 | 9/2017 | Barnes et al. |
| 2018/0076051 A1 | 5/2018 | Shinoda et al. |
| 2019/0318937 A1 | 10/2019 | Yang et al. |
| 2020/0075313 A1 | 3/2020 | Wang et al. |
| 2020/0135554 A1 | 4/2020 | Hou et al. |
| 2021/0057213 A1 | 2/2021 | Ito et al. |
| 2021/0118694 A1 | 4/2021 | Zhang et al. |

OTHER PUBLICATIONS

International Search Report and Written Opinion for PCT/US2021/024094, dated Aug. 4, 2021.

* cited by examiner

PROCESSING OF WORKPIECES USING FLUOROCARBON PLASMA

PRIORITY

The present application claims the benefit of priority of U.S. Provisional Application Ser. No. 63/002,571, titled "Processing of Workpieces Using Flourocarbon Plasma," filed Mar. 31, 2020, which is incorporated by reference for all purposes.

FIELD

The present disclosure relates generally to semiconductor processing.

BACKGROUND

Plasma etch processes (e.g., dry etch processes) can be used in semiconductor fabrication as a method for removing TiN and/or other materials patterned on a workpiece during semiconductor fabrication. Plasma etch processes can use reactive species (e.g., radicals) extracted from a plasma generated from one or more process gases to etch and/or remove silicon and other layers from a surface of a workpiece. For instance, in some plasma etch processes, neutral species from a plasma generated in a remote plasma chamber pass through a separation grid into a processing chamber. The neutral species can be exposed to a workpiece, such as a semiconductor wafer, to remove TiN from the surface of the workpiece. The removal of TiN can be selective over other materials, such as tungsten or silicon, or can be isotropic with equal etch rate in each exposed surface, or can be anisotropic with higher etch rate in vertical direction compared to horizontal direction.

SUMMARY

Aspects and advantages of embodiments of the present disclosure will be set forth in part in the following description, or may be learned from the description, or may be learned through practice of the embodiments.

Aspects of the present disclosure provide methods for processing a workpiece. The method includes placing a workpiece on a workpiece support in a processing chamber, the workpiece comprising a tungsten layer and a titanium nitride (TiN) layer; performing a breakthrough process on the workpiece to at least partially remove an oxide layer or a polymeric layer on the titanium nitride layer of the workpiece; performing an etch process on the titanium nitride layer to at least partially remove the titanium nitride layer of the workpiece at an etch rate that is greater than an etch rate for the tungsten layer during the etch process, wherein the etch process comprises exposing the workpiece to nitrogen species, oxygen species, fluorine species and hydrogen species; and removing the workpiece from the processing chamber.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
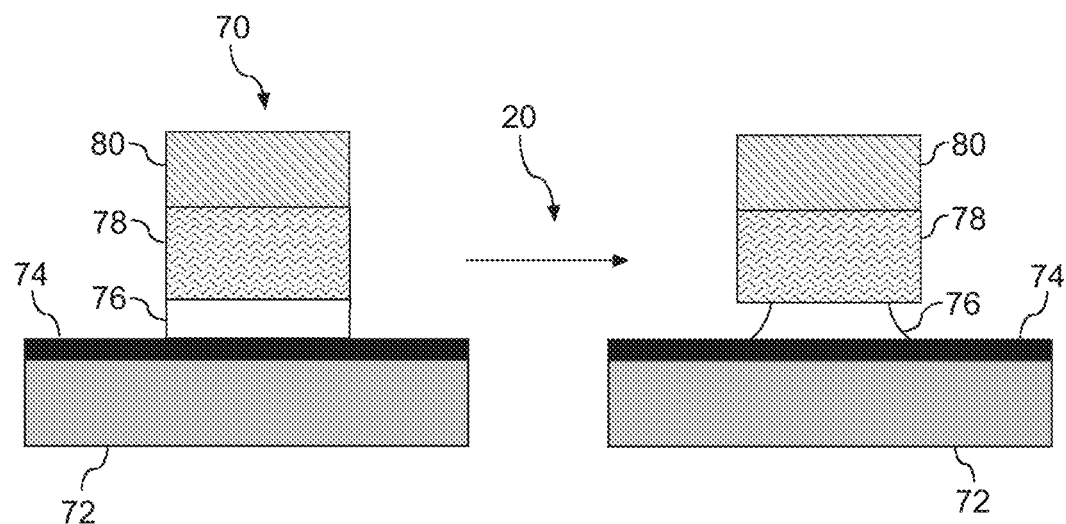
FIG. 1 depicts an example etch process according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece to selectively remove titanium nitride (TiN) relative to tungsten (W) and $SiO_2$ from the surface of a workpiece in preparation for further processing. More specifically, aspects of the present disclosure are directed to removal of certain oxide layers or oxide residues on titanium nitride layers on a workpiece prior to exposing the workpiece to an etch process. For instance, hydrogen radicals generated from a remote plasma or fluorocarbon species generated from a direct plasma may be utilized to at least partially remove an oxide layer from a titanium nitride layer present on a workpiece. The workpiece may then be exposed to an etch process to selectively remove the titanium nitride layer relative to a tungsten and $SiO_2$ layer.

Plasma dry etching plays a considerable role in fabricating high-performance semiconducting devices, especially as device dimensions continue to scale down to below 10 nm. Titanium nitride (TiN) is widely used in integrated circuit processing as a diffusion barrier in contacts, vias, and trenches and in interconnect stacks. It also serves as 'glue layer' for chemical vapor deposition (CVD) of tungsten and as a nucleation layer for CVD tungsten and CVD aluminum. In addition, titanium or TiN is also widely applied as a hard mask in the back-end of line to pattern structures, e.g. dual damascene structures. Complete removal of TiN films or residues from high aspect ratio structures with a minimum attack of other materials from the wafer surface, however, has proved difficult in the past. Complete cleaning of the TiN/TiSi$_2$ residues in the contact vias or trenches is critical to reduce contact resistance. Thus, a selective removal of TiN without eroding the underlying metal conductor layer, such as tungsten, or other dielectric materials is highly desired.

While critical dimensions of semiconductor devices continue to scale down, the pattern transfer process, mostly enabled by plasma dry etch, becomes critical, which simultaneously requires high selectivity, good uniformity (both wafer-in-wafer and wafer-to-wafer), residue-free, excellent profile tuning, etc. In this regard, light plasma etch with a good control of etch amount (in nanometer precision) is normally employed, especially in front-end or mid-end of processes. Thus, the surface properties of materials being removed or retained could play a critical role in etch selectivity, uniformity, and roughness control.

Known methods for removing TiN, include a wet etch process using a hot aqueous HF/HNO$_3$/H$_2$O$_2$ solution, in which TiN is first oxidized by HNO$_3$/H$_2$O$_2$ and then etched by HF. However, the wet process generates a large amount of chemical waste and also makes the process integration difficult. This wet process also has a high cost. Thus, a dry etch process for removing TiN is preferred.

Known dry etch processes for TiN typically include etching with a chlorine-based plasma. However, the high reactivity of chlorine-based gases, e.g., Cl$_2$ or BCl$_3$, poses considerable challenges on process tools and production line. The toxicity also introduces great environmental concerns. Thus, given the environmental concerns and high costs to operate tools for chlorine-based chemistries, there is a need for a dry plasma etch of TiN that is selective for TiN over tungsten that does not include chlorine-based chemistries. For example, the use of fluorine-based chemicals would be preferred. However, for fluorine-based chemistry, it can be challenging to achieve a selective TiN etch over W, since TiF$_4$ has a much higher boiling point as compared with WF$_6$ (284° C. vs. 17° C.).

Accordingly, example aspects of the present disclosure provide a two-part plasma dry etch method that is capable of selectively removing TiN over W. The first part includes a breakthrough process that specifically targets and selectively removes the surface oxidation layer or polymer residues present on TiN. Oxide layers present on the W layer, however, are not removed by the breakthrough process. The breakthrough process can utilize either remote plasma or reactive ion plasma, i.e. direct plasma. The second part of the process provided herein, includes an etch process that is capable of selectively etching TiN while keeping W layers and structures substantially intact. The etch process can be carried out in situ. Additionally, incorporation of the breakthrough process disclosed herein can improve the TiN etch rate and/or selectivity with respect to polysilicon or SiO$_2$.

Aspects of the present disclosure provide a number of technical effects and benefits. For instance, the example processes provided herein allow for the selective removal of TiN to W without damaging other materials or material layers on the workpiece. Further, the methods provided herein can be performed in situ in the same processing chamber saving processing time and money. The methods disclosed also provide for a fluorine-based, dry plasma etch of TiN that reduces damage to process tools and the production line as compared to chlorine-based processes. Additionally, the methods provided herein reduce toxicity and environmental concerns.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

FIG. 1 depicts an overview of a two-part etch process 20 according to example embodiments of the present disclosure. As shown, the workpiece 70 includes a substrate 72, a gate oxide layer 74, a TiN layer 76, a tungsten layer 78, and a photoresist layer 80. Exposure of the workpiece 70 to the etch process 20 allows for the removal of the lateral sides of the TiN layer 76 without causing removal or damage to the tungsten layer 78 or the underlying gate oxide layer 74. In some embodiments, the two-part process 20 includes a breakthrough process followed by an etch process. The breakthrough process is capable of removing an oxide layer, oxide residues, a polymeric layer, and/or organic residues from the TiN layer 76 prior to performing the etch process. In certain embodiments, the two-part process 20 can be performed in the same processing chamber without having to remove the workpiece from the processing chamber. Furthermore, in certain embodiments, the two-part process can provide a TiN etch rate of greater than about 200 Angstroms per minute and a TiN to W selectivity of greater than about 10:1, and TiN to polycrystalline silicon selectivity of greater than 20:1.

Figure 2:
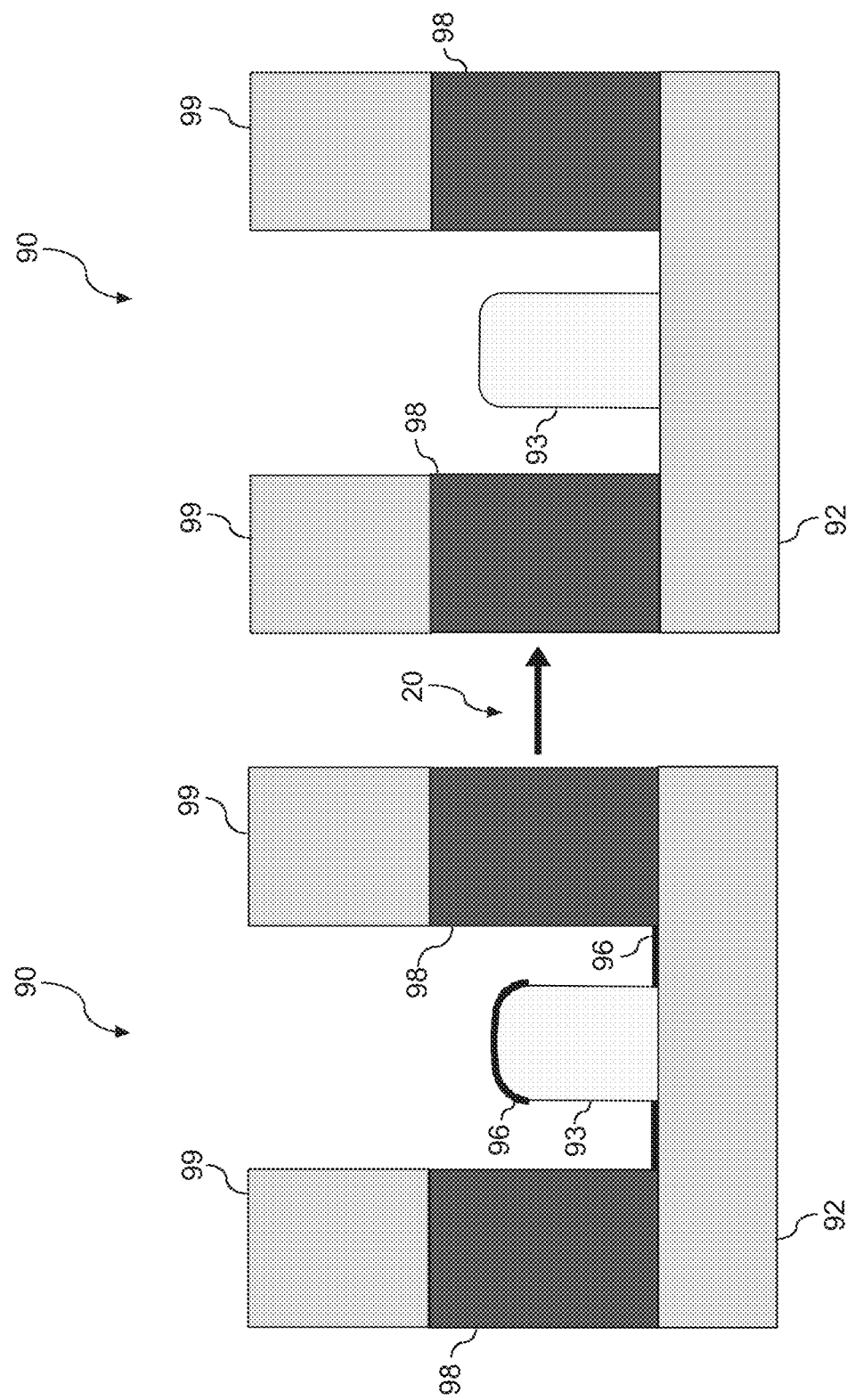
FIG. 2 depicts an example etch process according to example embodiments of the present disclosure.

FIG. 2 depicts an overview of a two-part etch process 20 according to example embodiments of the present disclosure. The workpiece 90 can be present in the mid-end or back-end of lines in advanced logic or memory device as contact vias. As shown, the workpiece 90 includes a underlying SiO$_2$ layer 92, a W plug 93 embedded in SiO$_2$ and partly exposed in the contact via with an aspect ratio of 10:1-30:1, a TiN/TiSi$_2$ residue layer 96 on top of W plug and via bottom, a polycrystalline Si sidewall 98 that determines the bottom critical dimension, and a SiO$_2$ layer 99 on top that determines the top critical dimension. Exposure of the workpiece 70 to the etch process 20 allows for the removal of the TiN/TiSi$_2$ residue layer 96 without causing removal or damage to the tungsten plug 93 or sidewall layers polycrystalline Si 98 and SiO$_2$ 99 that determine the critical dimension of the contact via. In some embodiments, the two-part process 20 includes a breakthrough process followed by an etch process. The breakthrough process is capable of removing an oxide layer, oxide residues, a polymeric layer, and/or organic residues from the TiN layer 96 prior to performing the etch process. In certain embodiments, the two-step process 20 can be performed in the same processing chamber without having to remove the workpiece from the processing chamber. Furthermore, in certain embodiments, the two-part process can provide a TiN etch rate of greater than about 200 Angstroms per minute, a TiN to W selectivity of greater than about 10:1, a TiN to SiO$_2$ selectivity of greater than 100:1, and TiN to polycrystalline silicon selectivity of greater than 20:1.

Other examples can include a SiO$_2$ layer. In certain embodiments, the two-part process can provide a TiN etch rate of greater than about 200 Angstroms per minute and a TiN to W selectivity of greater than about 10:1, and TiN to polycrystalline silicon selectivity of greater than 20:1.

Figure 3:
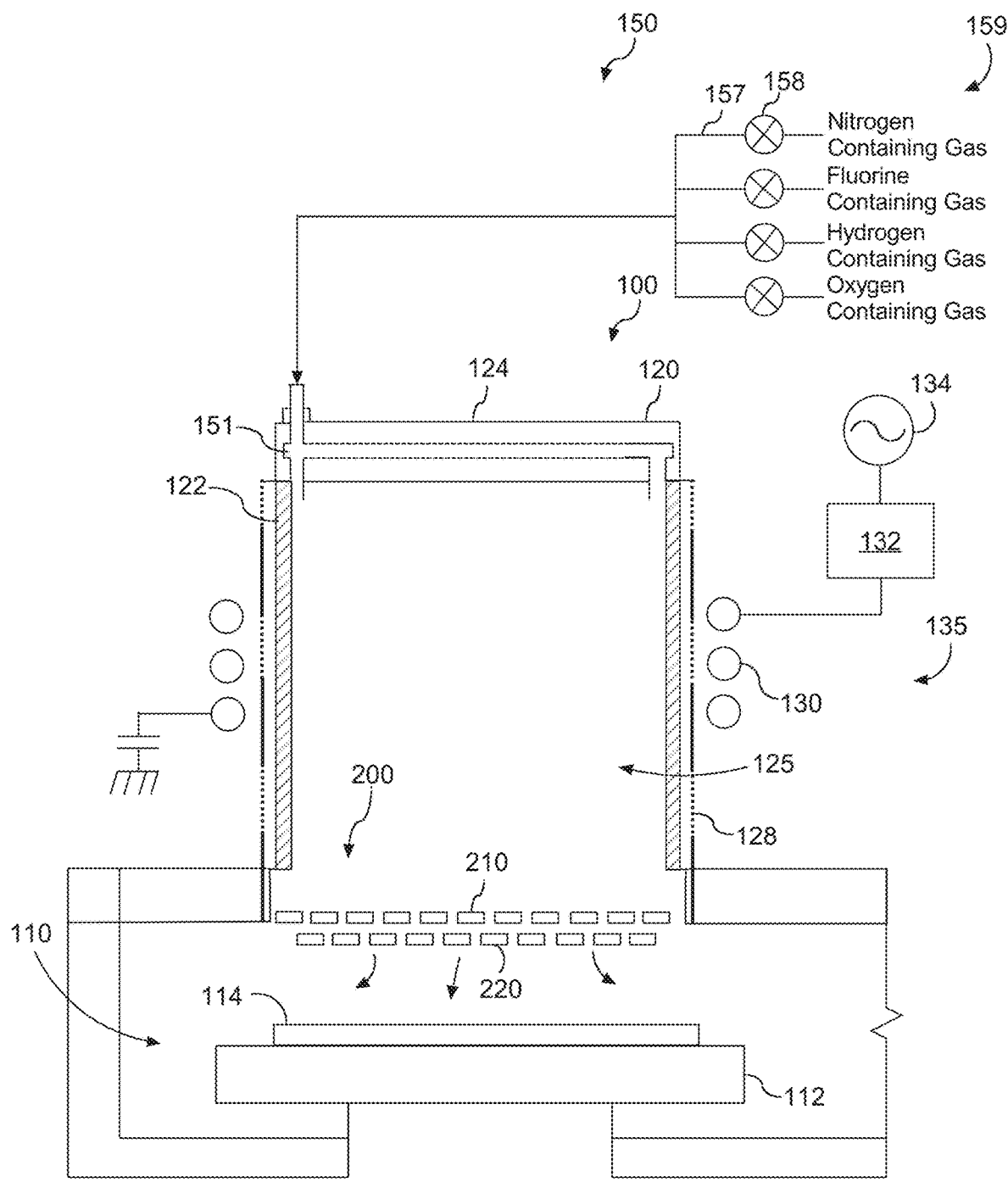
FIG. 3 depicts an example plasma processing apparatus according to example embodiments of the present disclosure.

FIG. 3 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases, for example a fluorine-containing gas or a hydrogen-containing gas, can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 3, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or mass flow controllers to deliver a desired amount of gases into the plasma chamber as process gas. As shown in FIG. 3, the gas delivery system 150 can include feed gas line(s) for delivery of an fluorine containing gas (e.g. CF$_4$, CHF$_3$, CH$_3$F, C$_4$F$_8$, C$_4$F$_6$, NF$_3$, SF$_6$), feed gas line(s) for delivery of a hydrogen containing gas (e.g., H$_2$, CH$_4$, or NH$_3$), feed gas line(s) for delivery of an oxygen containing gas (e.g., O$_2$, NO, CO, or CO$_2$), and feed gas line(s) for delivery of a nitrogen containing gas (e.g., N$_2$, NO, or NO$_2$). In some embodiments, the fluorine-containing gas, the hydrogen containing gas, and/or the oxygen containing gas can be mixed with an inert gas that can be called a "carrier" gas, such as He or Ar. A control valve and/or mass flow controller 158 can be used to control a flow rate of each feed gas line to flow a process gas into the plasma chamber 120. The plasma processing apparatus 150 of FIG. 3 can implement the breakthrough process and the etch process using remote plasma.

Figure 4:
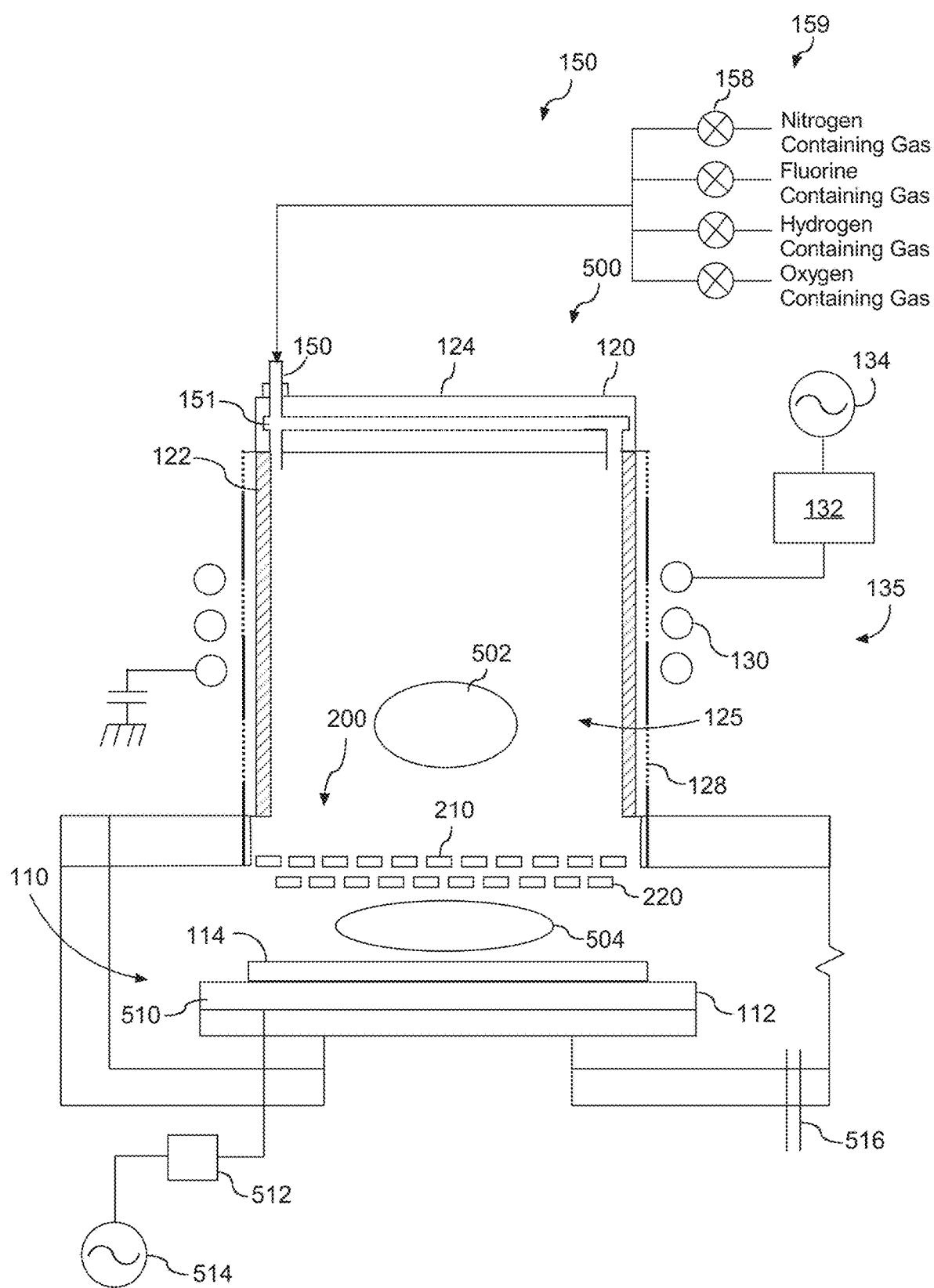
FIG. 4 depicts an example plasma processing apparatus according to example embodiments of the present disclosure.

FIG. 4 depicts an example plasma processing apparatus 500 that can be used to implement processes according to example embodiments of the present disclosure. The plasma processing apparatus 500 is similar to the plasma processing apparatus 100 of FIG. 3.

More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 4 is operable to generate a first plasma 502 (e.g., a remote plasma) in the plasma chamber 120 and a second plasma 504 (e.g., a direct plasma) in the processing chamber 110.

More particularly, the plasma processing apparatus 500 of FIG. 4 includes a bias source having a bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The radicals or species used in the breakthrough process or etch process according to example aspects of the present disclosure can be generated using the first plasma 502 and/or the second plasma 504.

Figure 5:
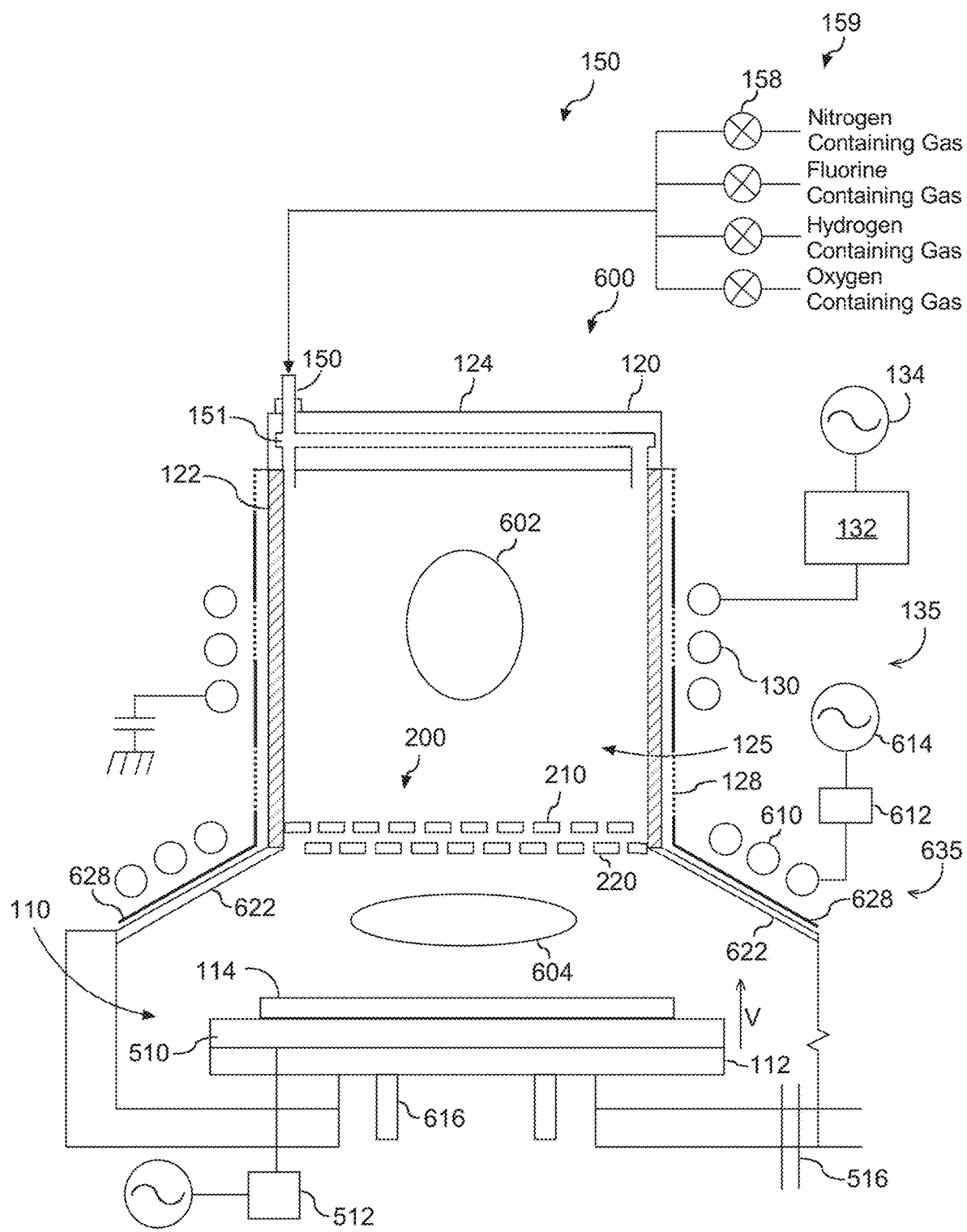
FIG. 5 depicts an example plasma processing apparatus according to example embodiments of the present disclosure.

FIG. 5 depicts a processing chamber 600 similar to that of FIG. 3 and FIG. 4. More particularly, plasma processing apparatus 600 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 5 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 5 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the photoresist etch processes according to example aspects of the present disclosure can be generated using the first plasma 602 and/or the second plasma 604.

Figure 6:
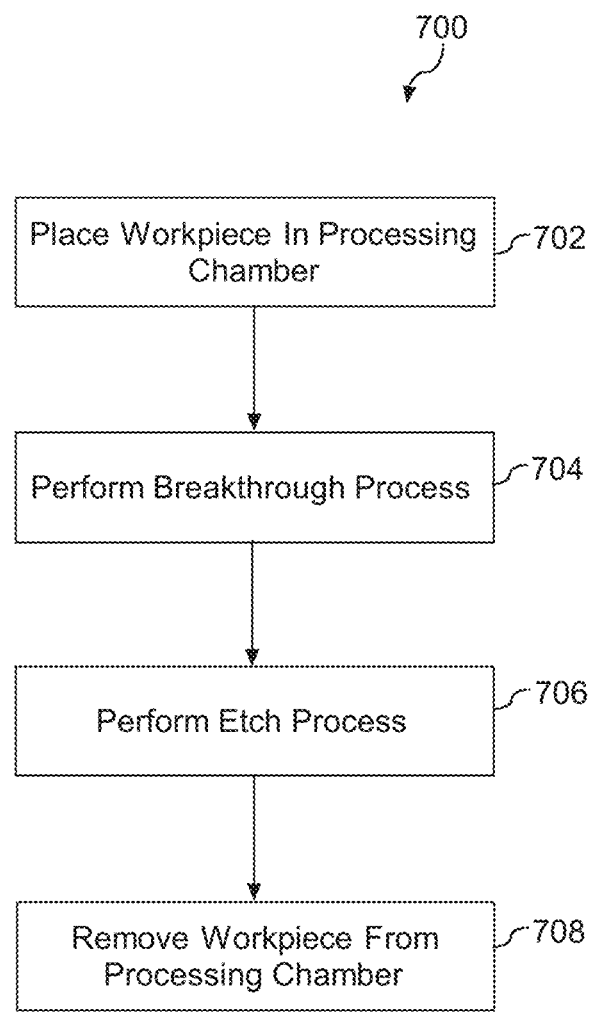
FIG. 6 depicts example flow diagram of an example TiN removal process according to example embodiments of the present disclosure.

FIG. 6 depicts a flow diagram of one example method (700) according to example aspects of the present disclosure. The method (700) will be discussed with reference to the plasma processing apparatus 500 of FIG. 4 by way of example. The method (700) can be implemented in any suitable plasma processing apparatus. FIG. 6 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a plasma processing apparatus 500. The processing chamber 110 can be separated from a plasma chamber 120 (e.g., separated by a separation grid assembly). For instance, the method can include placing a workpiece 114 onto workpiece support 112 in the processing chamber 110.

At (704), the method can include performing a breakthrough process, such as an oxide breakthrough process, to at least partially remove an oxide layer or other residues present on the titanium nitride layer of the workpiece 114. The breakthrough process can include admitting a process gas into the plasma chamber 120. For instance, a process gas can be admitted into the plasma chamber interior 125 from a gas source 150 via annular gas distribution channel 151 or other suitable gas introduction mechanism. In some embodiments, the process gas can include a hydrogen containing gas. In some embodiments, the hydrogen containing gas can include hydrogen ($H_2$), methane ($CH_4$), and combinations thereof. In some embodiments, the process gas can include another inert gas such as helium (He) or argon (Ar).

The process gas is energized via an inductively coupled plasma source to generate a plasma in a plasma chamber 120. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. The plasma can be used to generate one or more hydrogen radicals from a hydrogen containing process gas.

The breakthrough process (704) can include filtering one or more ions generated by the plasma to create a filtered mixture. The filtered mixture can include neutral hydrogen radicals. In some embodiments, the one or more ions can be filtered using a separation grid assembly 200 separating the plasma chamber 120 from a processing chamber 110 where the workpiece is located. For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

The breakthrough process (704) can include exposing the workpiece to the hydrogen radicals. More particularly, the workpiece can be exposed to hydrogen radicals generated in the plasma and passing through the separation grid assembly. As an example, hydrogen radicals can pass through the separation grid 200 and be exposed to the workpiece 114 in the processing chamber 110. Exposing the workpiece to hydrogen radicals can result in removal of at least a portion of an oxide layer or oxide residues that are present on the titanium nitride layer of the workpiece.

In other embodiments, the breakthrough process (704) can be implemented by exposing the workpiece 114 to one or more species generated by a fluorine containing gas using a direct plasma to implement a reactive ion etch on the oxide layer. The breakthrough process can include admitting a process gas into the processing chamber 110. For instance, a process gas can be admitted into the plasma chamber interior 125 from a gas source 150 via annular gas distribution channel 151 or other suitable gas introduction mechanism. The process gas can then flow from the plasma chamber interior 125 into the processing chamber 110. In certain embodiments, the process gas can be admitted directly into the processing chamber 110 via a gas injection port located within the processing chamber. (Not shown). In some embodiments, the process gas can include a fluorine containing gas. In some embodiments, the fluorine containing gas can include tetrafluoromethane ($CF_4$), hexafluoroethane ($C_2F_6$), tetrafluoroethylene ($C_2F_4$), fluoroform ($CHF_3$), difluoromethane ($CH_2F_2$), or fluoromethane ($CH_3F$), and combinations thereof. In some embodiments, the process gas can include another inert gas such as helium (He) or argon (Ar).

The process gas is energized via the bias electrode 510 located in the pedestal 112. When the bias electrode 510 is energized with RF energy, a direct plasma 504 can be generated from a process gas in the processing chamber 110 for direct exposure to the workpiece 114. The direct plasma 504 can be generated from a process gas, such as a fluorine containing gas, to generate fluorine species for exposure to the workpiece 114.

The breakthrough process (704) can include exposing the workpiece to the fluorine species generated in a direct plasma. More particularly, the workpiece can be exposed to fluorine species generated in the processing chamber 110 and exposed to the workpiece 114 in the processing chamber. Exposing the workpiece to fluorine species can result in removal of at least a portion of an oxide layer or polymeric layer that are present on the titanium nitride layer of the workpiece.

At (706), the method (700) can include performing an etch process to at least partially remove the titanium nitride layer from the workpiece 114. The etch process can include admitting a process gas into the plasma chamber 120. For instance, a process gas can be admitted into the plasma chamber interior 125 from a gas source 150 via annular gas distribution channel 151 or other suitable gas introduction mechanism. In some embodiments, the process gas can include a fluorine containing gas, an oxygen containing gas, a nitrogen containing gas, and a hydrogen containing gas. In some embodiments, the fluorine containing gas can include tetrafluoromethane ($CF_4$), hexafluoroethane ($C_2F_6$), tetrafluoroethylene ($C_2F_4$), fluoroform ($CHF_3$), difluoromethane ($CH_2F_2$), fluoromethane ($CH_3F$), nitrogen trifluoride ($NF_3$), and combinations thereof. In some embodiments, the process gas can include an oxygen containing gas such as oxygen ($O_2$), carbon monoxide (CO), carbon dioxide ($CO_2$), nitric oxide (NO), and combinations thereof. In some embodiments, the process gas can include a hydrogen containing gas such as hydrogen ($H_2$), methane ($CH_4$), ammonia ($NH_3$), and combinations thereof. In some embodiments, the process gas can include a nitrogen containing gas such as, nitric oxide (NO), nitrogen ($N_2$), ammonia ($NH_3$), and combinations thereof. In some embodiments, the process gas can include another inert gas such as helium (He) or argon (Ar). In some embodiments, the process gas includes a combination of tetrafluoromethane ($CF_4$) and oxygen ($O_2$). In such embodiments, the volume ratio of tetrafluoromethane ($CF_4$) to oxygen ($O_2$) is from about 1:10 to about 2:1.

The process gas is energized via an inductively coupled plasma source to generate a plasma in a plasma chamber 120. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. The plasma can be used to generate one or more radicals from the process gas.

The etch process (706) can include filtering one or more ions generated by the plasma to create a filtered mixture. The filtered mixture can include neutral hydrogen radicals, nitrogen radicals, fluorine radials, oxygen radicals, and combinations thereof. In some embodiments, the one or more ions can be filtered using a separation grid assembly 200 separating the plasma chamber 120 from a processing chamber 110 where the workpiece is located. For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

The etch process (704) can include exposing the workpiece to the filtered mixture. The filtered mixture can contain a mixture of radicals, such as hydrogen radicals, oxygen radicals, nitrogen radicals, and/or fluorine radicals. Exposing the workpiece to the filtered mixture can result in removal of at least a portion of a titanium nitride layer present on the workpiece 114. In certain embodiments, exposing the workpiece to the filtered mixture can result in removal at least a portion of a titanium nitride layer at an etch rate that is greater than an etch rate for the tungsten layer during the etch process. In certain embodiments, the etch rate of the titanium nitride is greater than about 100 angstroms per minute and less than about 300 angstroms per minute. In some embodiments, exposing the workpiece to radicals generated from the process gas can result in an etch selectivity of TiN to W greater than 1:1 and less than about 10:1. Additionally, exposing the workpiece to radicals generated from the process gas can result in an etch selectivity of TiN to polysilicon greater than 3:1 but less than about 10:1, and etch selectivity of TiN to $SiO_2$ greater than 20:1 but less than about 200:1.

In other embodiments, the etch process (704) can be implemented by exposing the workpiece 114 to one or more species generated by process gas using a direct plasma. The etch process can include admitting a process gas into the processing chamber 110. For instance, a process gas can be admitted into the plasma chamber interior 125 from a gas source 150 via annular gas distribution channel 151 or other suitable gas introduction mechanism. The gas introduced in the plasma chamber interior 125 can then flow into the processing chamber 110. In certain embodiments, the process gas can be admitting directly into the processing chamber 110 via a gas injection port(s) located within the processing chamber. (Not shown). In some embodiments, the process gas can include a fluorine containing gas, an oxygen containing gas, a nitrogen containing gas, and a hydrogen containing gas. In some embodiments, the fluorine containing gas can include tetrafluoromethane ($CF_4$), hexafluoroethane ($C_2F_6$), tetrafluoroethylene ($C_2F_4$), fluoroform ($CHF_3$), difluoromethane ($CH_2F_2$), fluoromethane ($CH_3F$), nitrogen trifluoride ($NF_3$) and combinations thereof. In some embodiments, the process gas can include an oxygen containing gas such as oxygen ($O_2$), carbon monoxide (CO), carbon dioxide ($CO_2$), nitric oxide (NO), and combinations thereof. In some embodiments, the process gas can include a hydrogen containing gas such as hydrogen ($H_2$), methane ($CH_4$), ammonia ($NH_3$), and combinations thereof. In some embodiments, the process gas can include a nitrogen containing gas such as, nitric oxide (NO), nitrogen ($N_2$), ammonia ($NH_3$), and combinations thereof. In some embodiments, the process gas can include another inert gas such as helium (He) or argon (Ar).

In certain embodiments, the process gas comprises a fluorine containing gas and argon in a volume ratio of from about 1:5 to about 1:1.

The process gas is energized via the bias electrode 510 located in the pedestal 112. When the bias electrode 510 is energized with RF energy, a direct plasma 504 can be generated from a process gas or mixture in the processing chamber 110 for direct exposure to the workpiece 114. For example, the direct plasma can be generated from a mixture of process gases to generate one or more hydrogen species, oxygen species, nitrogen species, fluorine species, and combinations thereof for exposure to the workpiece.

The etch process (704) can include exposing the workpiece to the species generated in a direct plasma. More particularly, the workpiece can be exposed to fluorine species, hydrogen species, oxygen species, and nitrogen species generated in the processing chamber 110 and exposed to the workpiece 114 in the processing chamber. Exposing the workpiece to species generated from the process gas can result in removal of at least a portion of a titanium nitride layer present on the workpiece. In certain embodiments, exposing the workpiece to species generated from the process gas can result in removal at least a portion of a titanium nitride layer at an etch rate that is greater than an etch rate for the tungsten layer during the etch process. In certain embodiments, the etch rate of the titanium nitride is greater than about 100 angstroms per minute and less than about 500 angstroms per minute. In some embodiments, exposing the workpiece to species generated from the process gas can result in an etch selectivity of TiN to W larger than 5:1 and less than about 20:1. Additionally, exposing the workpiece to radicals generated from the process gas can result in an etch selectivity of TiN to polysilicon greater than 1:1 but less than about 10:1, and etch selectivity of TiN to or $SiO_2$ greater than 2:1 but less than about 10:1. At (708) the method can include removing the workpiece from the processing chamber. For instance, the workpiece 114 can be removed from workpiece support 112 in the processing chamber 110. The plasma processing apparatus can then be conditioned for future processing of additional workpieces.

Example process parameters for the breakthrough process will now be set forth.

Example 1

Process Gas: $H_2$
Dilution Gas: He, Ar
Process Pressure: 100-900 mTorr
Inductively Coupled Plasma Source Power: 1000-2500 Watt
Workpiece Temperature: 20-80° C.
Process Period (time): 10-60 s
Gas Flow Rates for Process Gas:
Gas 1: 100-1000 sccm $H_2$
Dilution Gas: 500-2000 sccm He
Example process parameters for the breakthrough process will now be set forth.

Example 2

Process Gas: $CF_4$ and Ar
Dilution Gas: None
Process Pressure: 4 to 100 mTorr
Source Power: 600-2500 W
Bias Power: 20 to 200 W
Workpiece Temperature: 20-80° C.
Process Period (time): 10-60 s
Gas Flow Rates for Process Gas:
Gas 1: 100-500 sccm $CF_4$
Gas 2: 100-1000 sccm Ar
Example process parameters for the breakthrough process will now be set forth.

Example 3

Process Gas: $CF_4/O_2/N_2/H_2$
Dilution Gas: He
Process Pressure: 50-600 mTorr
Inductively Coupled Plasma Source Power: 1000-2500 W
Workpiece Temperature: 20-80° C.
Process Period (time): 30-200 s
Gas Flow Rates for Process Gas:
Gas 1: 50-200 sccm $CF_4$
Gas 2: 200-2000 sccm $O_2$
Gas 3: 200-1000 sccm $N_2$
Gas 4: 0-200 sccm $H_2$
Dilution Gas: 500-2000 sccm He
Example process parameters for the breakthrough process will now be set forth.

Example 4

Figure 7:
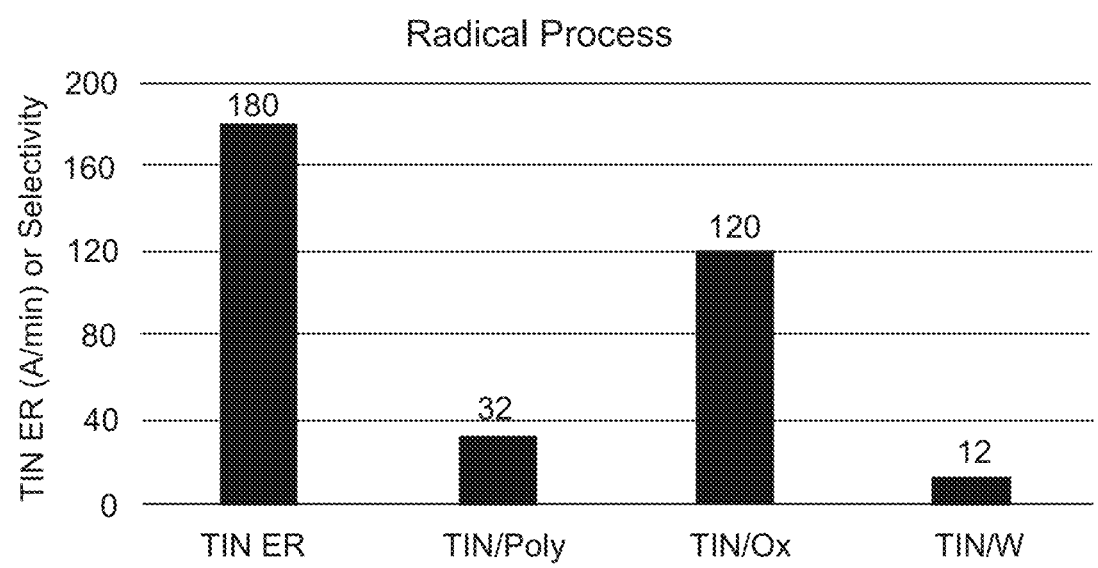
FIG. 7 depicts an example etch rate of TiN to polycrystalline silicon, $SiO_2$, and W of a radical-driven isotropic etch process.
Figure 8:
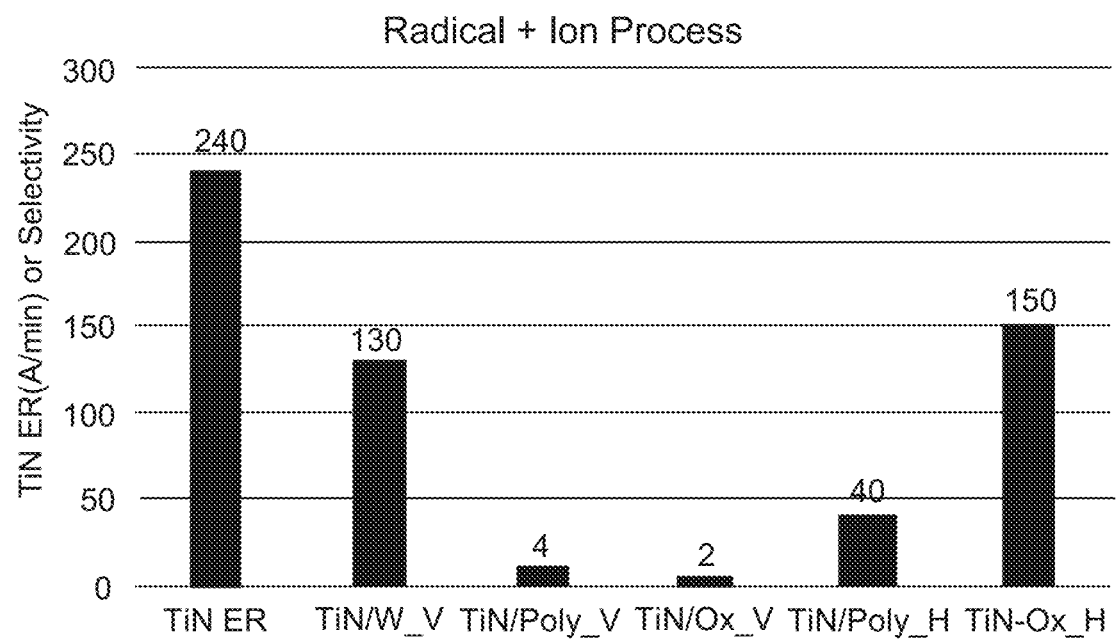
FIG. 8 depicts an example etch rate of TiN to polycrystalline silicon, $SiO_2$, and W of a reactive ion anisotropic etch process.

Process Gas: $CF_4/Ar$
Dilution Gas: He
Process Pressure: 4-100 mTorr
Source Power: 600-2500 W
Bias Power: 20-200 W
Workpiece Temperature: 20-80° C.
Process Period (time): 30-200 s
Gas Flow Rates for Process Gas:
Gas 1: 50-500 $CF_4$
Gas 2: 50-1000 Ar
Dilution Gas: 200-1000 He FIGS. 7 and 8 illustrate the TiN etch rate and its selectivity to polycrystalline silicon, $SiO_2$, and W. As illustrated in FIG. 7, with only source power on, F/O/N/H radicals are flowed onto the wafer surface, and almost >90% ions are filtered by grounded metal grids. The process is started with 20 seconds breakthrough by a $H_2$/He remote plasma and followed by 120 seconds $CF_4/O_2/N_2/H_2$/He remote plasma. A TiN etch rate of 180 A/min with selectivities to polycrystalline silicon, $SiO_2$, and W of 32, 120, and 12, respectively, can be achieved.

FIG. 8 illustrates another example TiN etch with an etch rate of ~240 A/min. The process includes an anisotropic etch process which is driven by the bias power, typical of reactive ion etch process. With the anisotropic etch process, TiN etch selectivities to polycrystalline silicon, $SiO_2$, and W reach 4, 2, and 130 in the vertical direction, respectively. In particular, the etch to the polycrystalline silicon and $SiO_2$, in the horizontal direction, for instance, the etch to the sidewall, is negligible, with TiN etch selectivity to polycrystalline silicon and $SiO_2$ of 40 and 150, respectively.

Figure 9:
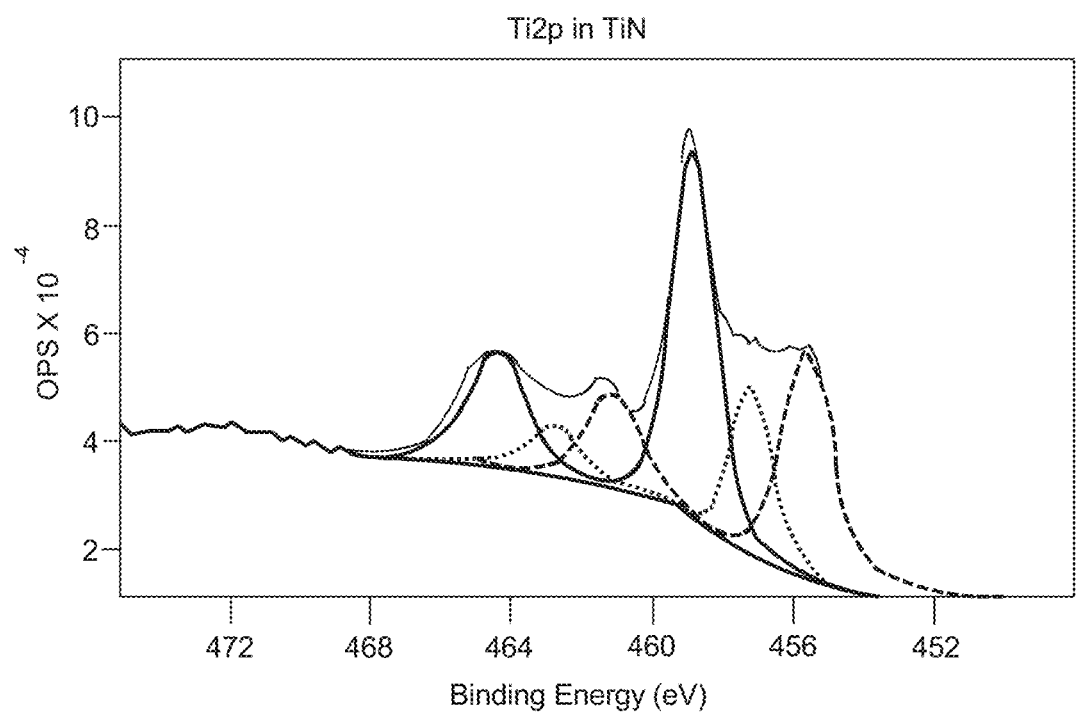
FIG. 9 depicts an example X-ray photoemission spectra of TiN.
Figure 10:
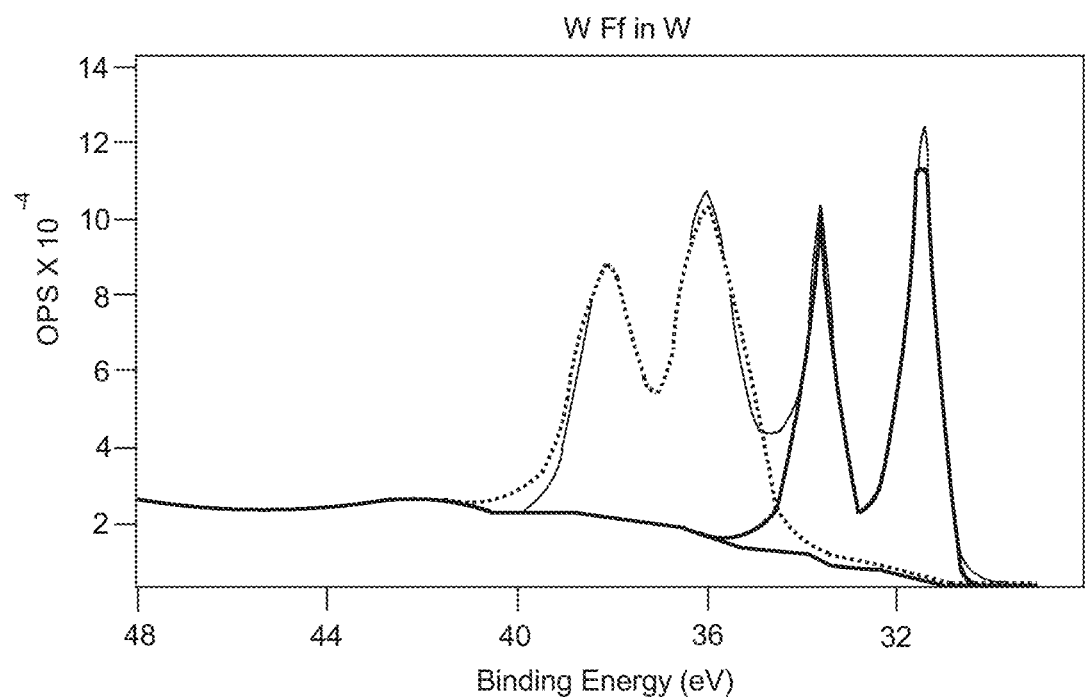
FIG. 10 depicts an example X-ray photoemission spectra of W.

FIGS. 9 and 10 illustrate the surface properties of TiN and W layers on a workpiece. The surface properties are shown via X-ray photoemission spectra. As shown, significant surface oxidation can be observed for both the TiN and W surfaces. For example, the TiN surface has an oxidation depth of about 5-10 nm.

FIG. 9 illustrates the composition of the oxide layer present on TiN. This surface layer as shown is composed of the following in atomic percentages: oxygen (33.6%) Ti (29.5%), N (24.6%) and C (10.2%). Deconvolution of Ti $2p$ spectrum indicates the dominance of $TiO_2$ and TiON, generally about 65 at % in this surface region.

FIG. 10 illustrates the composition of the oxide layer present on W. The oxide layer present on the W is composed of the following in atomic percentages: O (60%), W (25.6%), C (7.6%), and N (5.3%).

Accordingly, FIGS. 9 and 10 illustrate that the surface compositions of both TiN and W layers can include significant surface oxidation and have surface organic residues. Accordingly, the two-part method provided herein can breakthrough the oxide layer and residues present on the TiN layer, while allowing the oxide layer to remain on the W layer. This allows for a more selective etch for the TiN as compared to the W layer.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    placing a workpiece on a workpiece support in a processing chamber, the workpiece comprising a tungsten layer and a titanium nitride (TiN) layer;
    prior to an etch process, performing a breakthrough process on the workpiece to at least partially remove an oxide layer or a polymeric layer on the titanium nitride layer of the workpiece, wherein the breakthrough process comprises exposing the workpiece to hydrogen radicals;
    performing the etch process on the titanium nitride layer to at least partially remove the titanium nitride layer of the workpiece at an etch rate that is greater than an etch rate for the tungsten layer during the etch process, wherein the etch process comprises exposing the workpiece to nitrogen species, oxygen species, fluorine species and hydrogen species; and
    removing the workpiece from the processing chamber.

2. The method of claim 1, wherein the etch process is implemented using a remote plasma.

3. The method of claim 2, wherein the etch process comprises:
    admitting a process gas into a plasma chamber;
    energizing an induction coil to generate the remote plasma from the process gas;
    filtering one or more etch species generated in the remote plasma using a separation grid to create a filtered mixture, the separation grid separating the plasma chamber from the processing chamber; and
    exposing the workpiece to the filtered mixture in the processing chamber such that the filtered mixture at least partially etches the titanium nitride layer.

4. The method of claim 3, wherein the process gas comprises a fluorine containing gas, an oxygen containing gas, a nitrogen containing gas, and a hydrogen containing gas.

5. The method of claim 4, wherein the fluorine containing gas comprises tetrafluoromethane (CF4), hexafluoroethane ($C_2F_6$), tetrafluoroethylene ($C_2F_4$), fluoroform ($CHF_3$), difluoromethane ($CH_2F_2$), or fluoromethane ($CH_3F$).

6. The method of claim 4, wherein the oxygen containing gas comprises oxygen (O2), carbon monoxide (CO), carbon dioxide ($CO_2$), or nitric oxide (NO).

7. The method of claim 4, wherein the hydrogen containing gas comprises hydrogen ($H_2$), methane ($CH_4$), or ammonia ($NH_3$).

8. The method of claim 1, wherein the etch rate of the titanium nitride is greater than about 100 angstroms per minute and less than about 300 angstroms per minute.

9. The method of claim 1, wherein the etch process is implemented using a direct plasma.

10. The method of claim 9, wherein the etch process comprises:
    admitting a process gas into a processing chamber;
    energizing an electrode disposed in the workpiece support to generate a direct plasma from the process gas; and
    exposing the workpiece to the direct plasma in the processing chamber to at least partially etch the titanium nitride layer.

11. The method of claim 10, wherein the process gas comprises a fluorine containing gas, oxygen containing gas, nitrogen containing gas, and a hydrogen containing gas.

12. The method of claim 11, wherein the fluorine-containing gas comprises tetrafluoromethane (CF4), hexafluoroethane ($C_2F_6$), tetrafluoroethylene ($C_2F_4$), fluoroform ($CHF_3$), difluoromethane ($CH_2F_2$), or fluoromethane ($CH_3F$).

13. The method of claim 11, wherein the oxygen containing gas comprises oxygen (O2), carbon monoxide (CO), carbon dioxide ($CO_2$), or nitric oxide (NO).

14. The method of claim 11, wherein the hydrogen containing gas comprises hydrogen ($H_2$), methane ($CH_4$), or ammonia ($NH_3$).

15. The method of claim 1, wherein the breakthrough process comprises:
    exposing the workpiece to a hydrogen radical generated using a remote plasma.

16. The method of claim 1, wherein the breakthrough process comprises:
    exposing one or more species generated by a fluorine containing gas using a direct plasma to implement a reactive ion etch on the oxide layer.

17. A method for processing a workpiece, the method comprising:
    placing a workpiece on a workpiece support in a processing chamber, the workpiece comprising a tungsten layer and a titanium nitride (TiN) layer;

performing a breakthrough process on the workpiece to at least partially remove an oxide layer on the titanium nitride layer of the workpiece, wherein the breakthrough process comprise exposing the workpiece to hydrogen radicals;
admitting a process gas into a plasma chamber;
energizing an induction coil to generate a remote plasma from the process gas;
filtering one or more etch species generated in the remote plasma using a separation grid to create a filtered mixture, the separation grid separating the plasma chamber from the processing chamber, wherein the one or more etch species comprise nitrogen species, oxygen species, fluorine species, and hydrogen species;
exposing the workpiece to the filtered mixture in the processing chamber such that the filtered mixture at least partially etches the titanium nitride layer at an etch rate that is greater than an etch rate for the tungsten layer; and
removing the workpiece from the processing chamber.

18. The method of claim 17, wherein the breakthrough process comprises:
admitting a process gas into a plasma chamber, wherein the process gas comprises a hydrogen containing gas;
energizing an induction coil to generate the remote plasma from the process gas;
filtering one or more species generated in the remote plasma using a separation grid to create a filtered mixture comprising hydrogen radicals, the separation grid separating the plasma chamber from the processing chamber; and
exposing the workpiece to the filtered mixture comprising hydrogen radicals in the processing chamber such that the filtered mixture at least partially removes the oxide layer.

19. The method of claim 17, wherein the breakthrough process comprises:
admitting a process gas into a processing chamber, wherein the process gas comprises a fluorine containing gas;
energizing an electrode disposed in the workpiece support to generate a direct plasma from the process gas; and
exposing the workpiece to the direct plasma in the processing chamber to at least partially remove the oxide layer.

* * * * *